(12) United States Patent
Yamamichi et al.

(10) Patent No.: US 7,889,514 B2
(45) Date of Patent: Feb. 15, 2011

(54) WIRING BOARD, SEMICONDUCTOR DEVICE, AND METHOD OF MANUFACTURING THE SAME

(75) Inventors: Shintaro Yamamichi, Tokyo (JP); Katsumi Kikuchi, Tokyo (JP); Yoichiro Kurita, Kanagawa (JP); Koji Soejima, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 850 days.

(21) Appl. No.: 11/544,732

(22) Filed: Oct. 10, 2006

(65) Prior Publication Data

US 2007/0079987 A1    Apr. 12, 2007

(30) Foreign Application Priority Data

Oct. 12, 2005    (JP) .............................. 2005-298186

(51) Int. Cl.
*H05K 1/11* (2006.01)
(52) U.S. Cl. .................. 361/795; 361/770; 361/771; 174/260; 257/737; 257/744
(58) Field of Classification Search .............. 361/795, 361/770–774; 174/260; 257/737–744
See application file for complete search history.

(56) References Cited

U.S. PATENT DOCUMENTS

2004/0134681 A1*   7/2004  Tsukahara et al. .......... 174/255
2005/0088833 A1*   4/2005  Kikuchi et al. .............. 361/763
2005/0252682 A1*   11/2005  Shimoto et al. ............. 174/260

FOREIGN PATENT DOCUMENTS

JP    2001-345418 A    12/2001

\* cited by examiner

*Primary Examiner*—Tuan T Dinh
*Assistant Examiner*—Andargie M Aychillhum
(74) *Attorney, Agent, or Firm*—Sughrue Mion, PLLC (57) ABSTRACT

A semiconductor device comprising a flat wiring board, a first LSI disposed on one surface of the wiring board, a sealing resin for covering the one surface and a side face of the first semiconductor element, and a second LSI disposed on another surface of the wiring board. The wiring board has conductive wiring as a wiring layer, an insulation resin as a support layer for the wiring layer, and a conductive through-hole that passes through the wiring layer and the support layer. Connection points between lands disposed in positions in which the external peripheral edges of the semiconductor elements transverse the interior of the lands as viewed vertically from above, which lands are selected from land portions on which the external connection terminals are formed, and the wiring board formed in the same plane as the lands, are unevenly distributed toward one side of the wiring board. Connections for very small wiring are thereby made possible, and a plurality of semiconductor elements can be very densely connected.

12 Claims, 12 Drawing Sheets

PEELING DIRECTION

WIRING BOARD, SEMICONDUCTOR DEVICE, AND METHOD OF MANUFACTURING THE SAME

BACKGROUND OF THE INVENTION

1. Field of the Invention

The present invention relates to a wiring board that allows semiconductor devices and the like to be very densely mounted with high precision and that allows a package and module having excellent high-speed and reliability characteristics to be obtained, to a semiconductor device that uses the wiring board, and to a method of manufacturing the same.

2. Description of the Related Art

The semiconductor device described in Japanese Laid-open Patent Application No. 2001-345418 is an example of a conventional semiconductor device. In this publication, a two-sided mounted structure is disclosed in which semiconductor devices are placed by flip-chip mounting on the two sides of a circuit board. In accordance with the prior art, production yield and reliability can be improved by adjusting the glass transition temperature of the sealing resin that seals the mounted semiconductor devices.

However, in the prior art described above, the connection precision and quality tends to degrade due to the difference in the coefficient of thermal expansion between the substrate and the board of the semiconductor elements. For this reason, there are problems in that it is difficult to make very small wiring connections to the semiconductor elements, and the connection reliability is poor. It is therefore difficult to implement a large number of connections between chips having high wiring density by using this prior art.

SUMMARY OF THE INVENTION

An object of the present invention is to provide a wiring board having high connection reliability, a semiconductor device, and a manufacturing method of the same that allow very small wiring connections to be made, and that allow highly dense connections to be made among a plurality of semiconductor elements.

The wiring board according to the first aspect of the present invention comprises one or a plurality of insulation layers, one or a plurality of wiring layers, and one or a plurality of vias formed in the insulation layers, the wiring board further comprising external connection terminals disposed on both surfaces of the wiring board, wherein connection points between at least a portion of lands in the vicinity of the mounting positions of semiconductor elements, which lands are selected from land portions on which the external connection terminals are formed, and the wiring layers formed in the same plane as the lands, are unevenly distributed toward one side of the wiring board.

The wiring board according to the second aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein connection points between all lands in the vicinity of the mounting positions of semiconductor elements, which lands are selected from land portions on which the external connection terminals are formed, and the wiring layers formed in the same plane as the lands, are unevenly distributed toward one side of the wiring board.

The wiring board according to the third aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein connection points between lands disposed in positions in which the external peripheral edges of the semiconductor elements transverse the interior of the lands as viewed vertically from above, which lands are selected from land portions on which the external connection terminals are formed, and the wiring layers formed in the same plane as the lands, are unevenly distributed toward one side of the wiring board.

The wiring board according to the fourth aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein at least a portion of lands in the vicinity of the mounting positions of semiconductor elements, which lands are selected from land portions on which the external connection terminals are formed, are shaped so as to gradually increase and then gradually decrease in width in the direction away from portions connected to the wiring layers formed in the same plane as the lands, and toward one side of the wiring board.

The wiring board according to the fifth aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein all the lands in the vicinity of the mounting positions of semiconductor elements, which lands are selected from land portions on which the external connection terminals are formed, are shaped so as to gradually increase and then gradually decrease in width in the direction away from portions connected to the wiring layers formed in the same plane as the lands, and toward one side of the wiring board.

The wiring board according to the sixth aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein lands disposed in positions in which the external peripheral edges of the semiconductor elements transverse the interior of the lands as viewed vertically from above, which lands are selected from land portions on which the external connection terminals are formed, are shaped so as to gradually increase and then gradually decrease in width in the direction away from portions connected to the wiring layers formed in the same plane as the lands, and toward one side of the wiring board.

The wiring board according to the seventh aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein portions connected to the wiring layers formed in the same plane as the lands in at least a portion of lands in the vicinity of the mounting positions of semiconductor elements, which lands are selected from land portions on which the external connection terminals are formed, are tapered only toward one side of the wiring board.

The wiring board according to the eighth aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein portions connected to the wiring layers formed in the same plane as the lands in all the lands in the vicinity of the mounting positions of semiconductor elements, which lands are selected from land portions on which the external connection terminals are formed, are tapered only toward one side of the wiring board.

The wiring board according to the ninth aspect of the present invention comprises one or a plurality of insulation layers, one or a plurality of wiring layers, and one or a plurality of vias formed in the insulation layers; the wiring board further comprising external connection terminals disposed on both surfaces of the wiring board, wherein portions connected to the wiring layers formed in the same plane as the lands in lands in which the external peripheral edges of the semiconductor elements transverse the interior of the lands as viewed vertically from above, which lands are selected from land portions on which the external connection terminals are formed, are tapered only toward one side of the wiring board.

The semiconductor device according to the tenth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board, the wiring board having a wiring layer, a support layer for supporting the wiring layer, and a through-electrode that passes through the wiring layer and the support layer; and the first semiconductor element and the second semiconductor element being electrically connected by way of the wiring board; wherein connection points between at least a portion of lands in the vicinity of the mounting positions of semiconductor elements, which lands are selected from land portions on which external connection terminals are disposed, and the wiring board formed in the same plane as the lands, are unevenly distributed toward one side of the wiring board.

The semiconductor device according to the eleventh aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein connection points between all the lands in the vicinity of the mounting positions of semiconductor elements, which lands are selected from land portions on which external connection terminals are disposed, and the wiring board formed in the same plane as the lands, are unevenly distributed toward one side of the wiring board.

The semiconductor device according to the twelfth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein connection points between lands disposed in positions in which the external peripheral edges of the semiconductor elements transverse the interior of the lands as viewed vertically from above, which lands are selected from land portions on which the external connection terminals are formed, and the wiring board formed in the same plane as the lands, are unevenly distributed toward one side of the wiring board.

The semiconductor device according to the thirteenth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein at least a portion of lands in the vicinity of the mounting positions of semiconductor elements, which lands are selected from land portions on which the external connection terminals are formed, are shaped so as to gradually increase and then gradually decrease in width in the direction away from portions connected to the wiring board formed in the same plane as the lands, and toward one side of the wiring board.

The semiconductor device according to the fourteenth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein all the lands in the vicinity of the mounting positions of semiconductor elements, which lands are selected from land portions on which the external connection terminals are formed, are shaped so as to gradually increase and then gradually decrease in width in the direction away from portions connected to the wiring board formed in the same plane as the lands, and toward one side of the wiring board.

The semiconductor device according to the fifteenth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein lands disposed in positions in which the external peripheral edges of the semiconductor elements transverse the interior of the lands as viewed vertically from above, which lands are selected from land portions on which the external connection terminals are formed, are shaped so as to gradually increase and then gradually decrease in width in the direction away from portions connected to the wiring board formed in the same plane as the lands, and toward one side of the wiring board.

The semiconductor device according to the sixteenth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein portions connected to the wiring board formed in the same plane as the lands in at least a portion of lands in the vicinity of the mounting positions of semiconductor elements, which lands are selected from land portions on which the external connection terminals are formed, are tapered only toward one side of the wiring board.

The semiconductor device according to the seventeenth aspect of the present invention comprises a flat wiring board; a first semiconductor element disposed on one surface of the wiring board; a sealing resin for covering the one surface and a side face of the first semiconductor device; a second semiconductor element disposed on another surface of the wiring board; the wiring board having a wiring layer, a support layer for supporting the wiring layer, and a through-electrode that passes through the wiring layer and the support layer; and the first semiconductor element and the second semiconductor element being electrically connected by way of the wiring board; wherein portions connected to the wiring board formed in the same plane as the lands in all the lands in the vicinity of the mounting positions of semiconductor elements, which lands are selected from land portions on which the external connection terminals are formed, are tapered only toward one side of the wiring board.

The semiconductor device according to the eighteenth aspect of the present invention comprises-a flat wiring board; a first semiconductor element disposed on one surface of the wiring board; a sealing resin for covering the one surface and a side face of the first semiconductor device; a second semiconductor element disposed on another surface of the wiring board; the wiring board has a wiring layer, a support layer for supporting the wiring layer, and a through-electrode that passes through the wiring layer and the support layer; and the first semiconductor element and the second semiconductor element being electrically connected by way of the wiring board; wherein portions connected to the wiring board formed in the same plane as the lands in those lands in which the external peripheral edges of the semiconductor elements transverse the interior of the lands as viewed vertically from above, which lands are selected from land portions on which the external connection terminals are formed, are tapered only toward one side of the wiring board.

The wiring board according to the present invention is preferably one in which the support layer is an insulation layer composed of an organic resin.

The semiconductor device according to the present invention is preferably one which the support layer is an insulation layer composed of an organic resin.

In accordance with the wiring board and semiconductor device of the present invention, a semiconductor device having a short wiring length for connecting to a plurality of semiconductor elements can be provided, and high-speed operation is made possible. Also, since the strength of portions in which stress is concentrated during the manufacturing process is high, high-yield production is made possible without generating wiring breakages and cracks. Reliability is high in the temperature cycles of the semiconductor device itself, and secondary mounting reliability when a semiconductor device is mounted on a printed board is also increased, because the wiring is free from internal stress or very small cracks that cannot be observed from the exterior.

DESCRIPTION OF THE PREFERRED EMBODIMENTS

Figure 1:
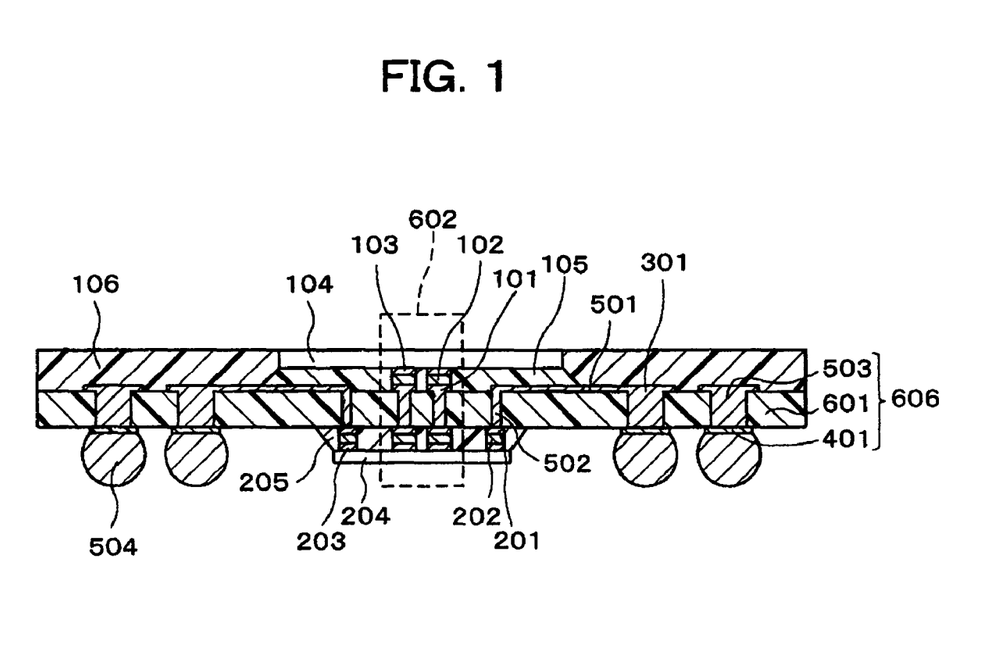
FIG. 1 is a diagram showing the wiring board and semiconductor device of the first embodiment of the present invention.

Embodiments of the present invention are described in detail below with reference to the attached diagrams. Described first is the first embodiment of the present invention. FIG. 1 is a diagram that shows the cross-sectional structure of the wiring board 606 of the present embodiment and a semiconductor device 700 that uses the wiring board. BGA balls 504 are connected to the wiring board 606, and the distinctive features are the shape of the BGA lands and the structure for connecting the conductor wiring 501 to the BGA lands 301 to which the BGA balls (not shown in FIG. 1) are connected in specific locations.

Figure 2A:
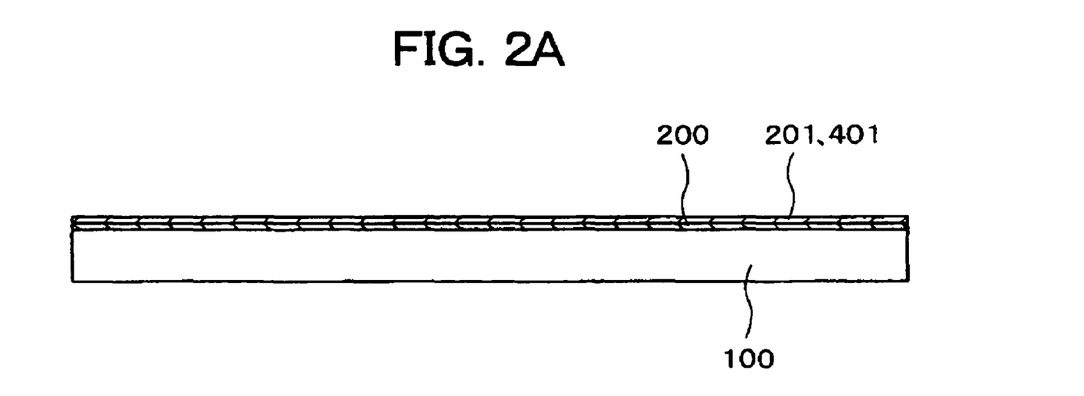
FIGS. 2A to 2C are diagrams showing the method of manufacturing the wiring board and semiconductor device of the present embodiment.
Figure 2B:
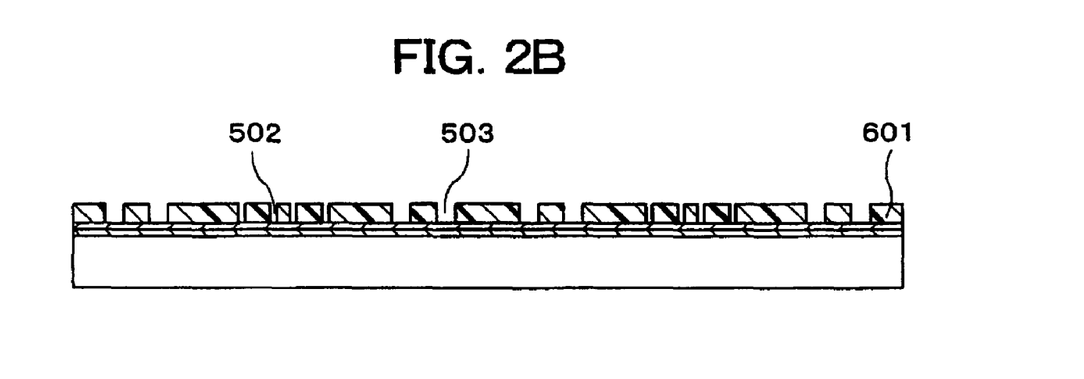
Figure 2C:
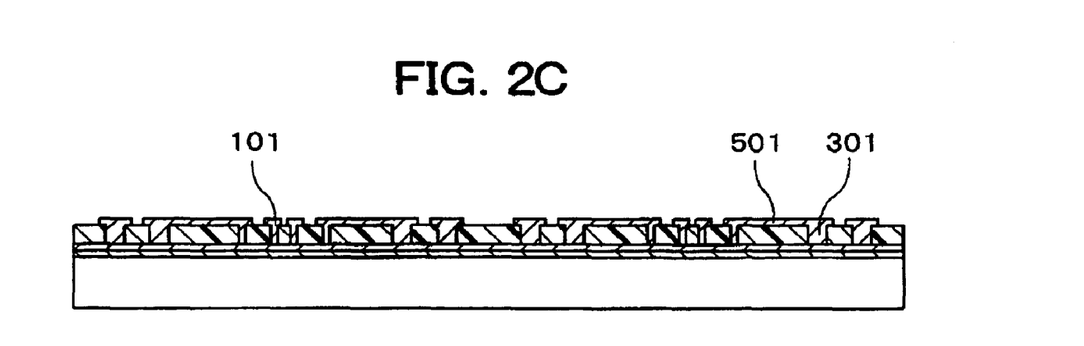

First, the method of manufacturing the wiring board and semiconductor device of the present embodiment is described with reference to FIGS. 2 to 5. FIGS. 2 to 5 are cross-sectional diagrams showing, as a sequence of steps, the method of manufacturing the wiring board and semiconductor device of the present embodiment. A release layer 200 and a wiring layer ultimately provided with second LST connection pads 201 and second BGA lands 401 are formed on a silicon board 100, as shown in FIG. 2A. An insulation resin 601 is subsequently formed on the wiring layer, and conduction vias 502 and conduction through-holes 503 are formed in required locations, as shown in FIG. 2B. Conductive wiring 501 is then formed so as to fill in the conduction vias and conduction through-holes, as shown in FIG. 2C.

Figure 3A:
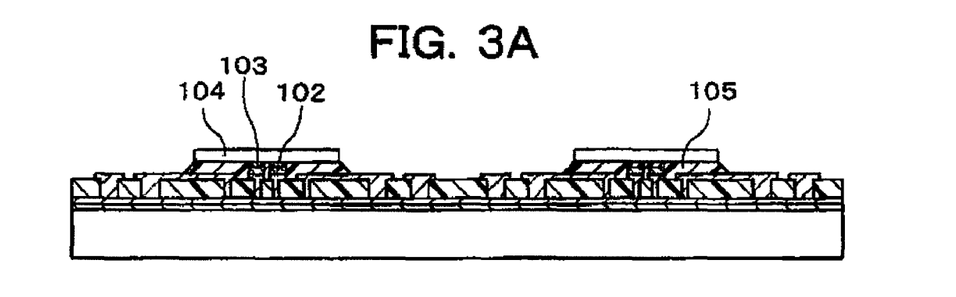
FIGS. 3A to 3C are diagrams showing the method of manufacturing the wiring board and semiconductor device of the present embodiment, and are steps that follow those in FIG. 2.
Figure 3B:
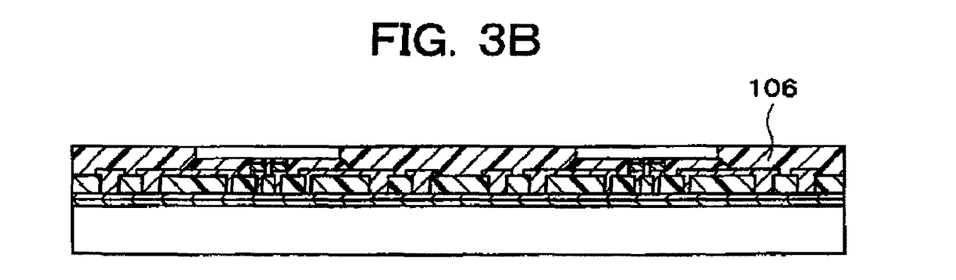
Figure 3C:
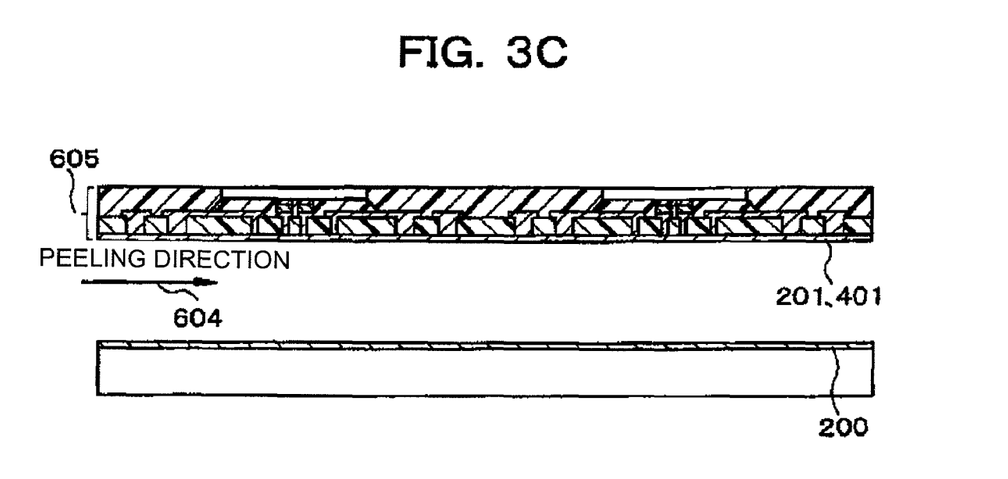

Next, first LSI connection pads 101 and connection pads 103 are connected using first LSI connection bumps 102 to mount a first LSI 104, as shown in FIGS. 1 and 3A. An underfill resin 105 is injected, and the structure is sealed using a mold resin 106, as shown in FIG. 3B. A mold wafer portion 605 is peeled away from the silicon board in a single direction 604, as shown in FIG. 3C.

Figure 4A:
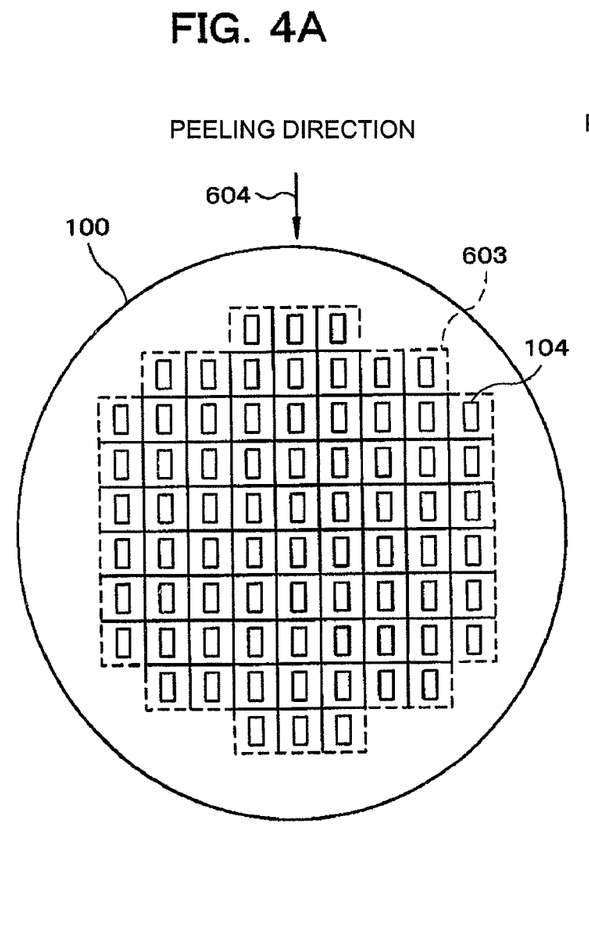
FIGS. 4A and 4B are diagrams showing the peeling direction in the method of manufacturing the wiring board and semiconductor device of the present embodiment.
Figure 4B:
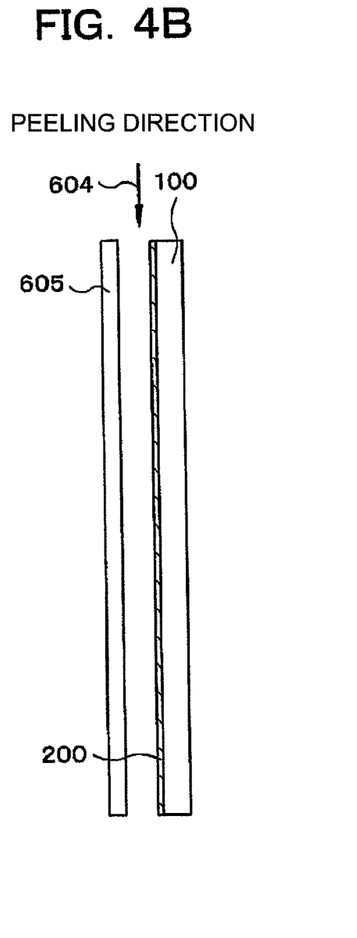

The state of this peeling process is shown in FIG. 4. FIG. 4A shows the state in which a plurality of first LSIs 104 are connected to a wiring layer on the silicon board 100. The mold wafer portion 605 is separated from the silicon board 100 by mechanical force applied from the pealing direction 604. At this point in the step for removing the silicon board 100, a material is selected in advance that reduces the adhesive strength of the boundary between the silicon board 100 and the release layer 200, and between the release layer 200 and the wiring layers 201 and 401; and a mechanical force is applied to peel away the silicon board 100. By selecting as the release layer 200 a material that dissolves in a specific solution or a material whose adhesion to the wiring layers 201 and 401 or to the silicon board 100 is dramatically reduced when permeated by a solution, it is possible to allow the solution to permeate the material via the surface facing the release layer 200 and to then peel away the silicon board 100. If a material that thermally decomposes is used as the release layer 200, the wiring layers 201 and 401 and the silicon board 100 can be separated by heating the layer to the thermal decomposition temperature or higher in the step for removing the silicon board 100. In this case, heating is preferably carried out using a laser or another method for providing localized heating. The release layer 200 alone can be locally heated by setting the wavelength of the laser to a level at which the light passes through the silicon board 100 but does not pass through the release layer 200. In the present embodiment, a low-adhesive polyimide film is used as the release layer 200, the adhesive strength of the boundary between the release layer 200 and the wiring layers 201 and 401 is reduced, and mechanical force is applied to peel away the silicon board 100.

Figure 5A:
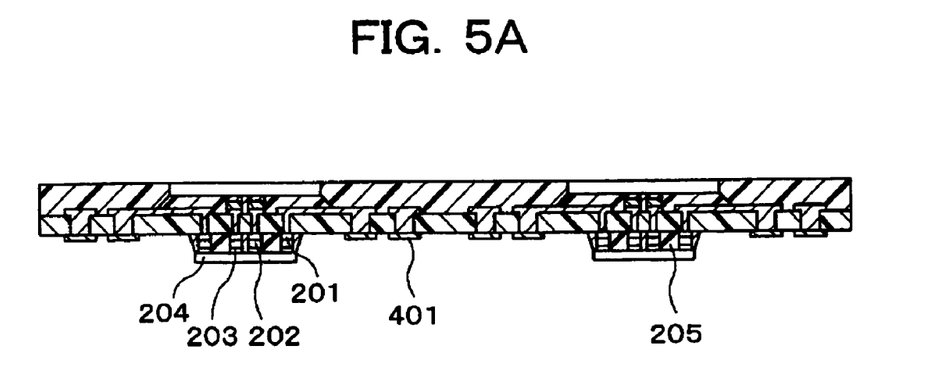
FIGS. 5A to 5C are diagrams showing the method of manufacturing the wiring board and semiconductor device of the present embodiment.

Next, a wiring layer is disposed on second LSI connection pads 201 and second BGA lands 401, and second LSI connection pads 201 and connection pads 203 are thereafter connected using second LSI connection bumps 202 to mount a second LSI 204, as shown in FIG. 5A. An underfill resin 205 is then injected.

Figure 5B:
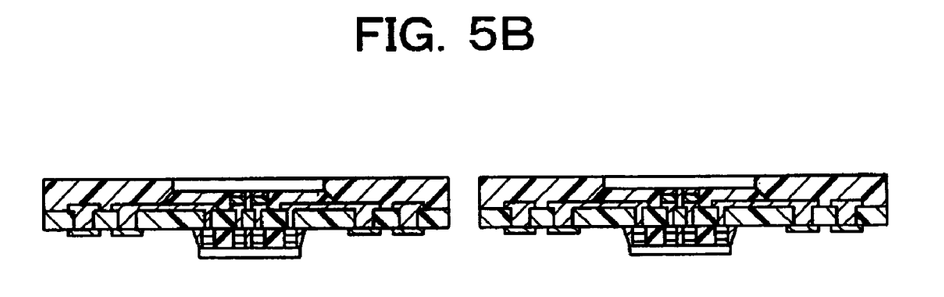
Figure 5C:
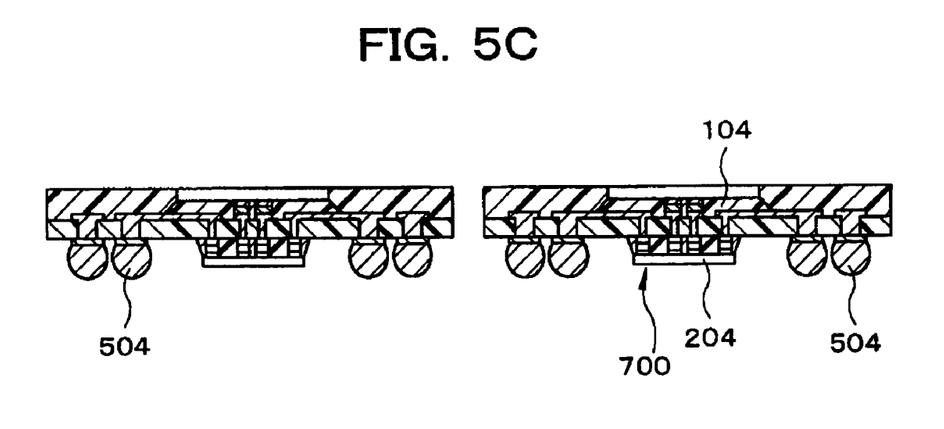

Next, each segmented semiconductor device is separated, as shown in FIG. 5B; BGA balls 504, which are the ultimate external terminals, are thereafter mounted; and the semiconductor device 700 is completed, as shown in FIG. 5C.

In such a semiconductor device 700, the communication speed between the LSIs in the semiconductor device can be improved in comparison with ordinary wire bonding because the first LSI 104 having a large chip size and the second LSI 204 having a small chip size can be connected with a short distance using very small conduction vias. The degree of freedom in selecting the size of the LSIs to be mounted is increased, and, depending on the number of BGA balls, which are the ultimate external terminals, a structure can be created in which the external shape of the LSI would include the BGA ball portion as well, as shown in FIG. 6.

Figure 6:
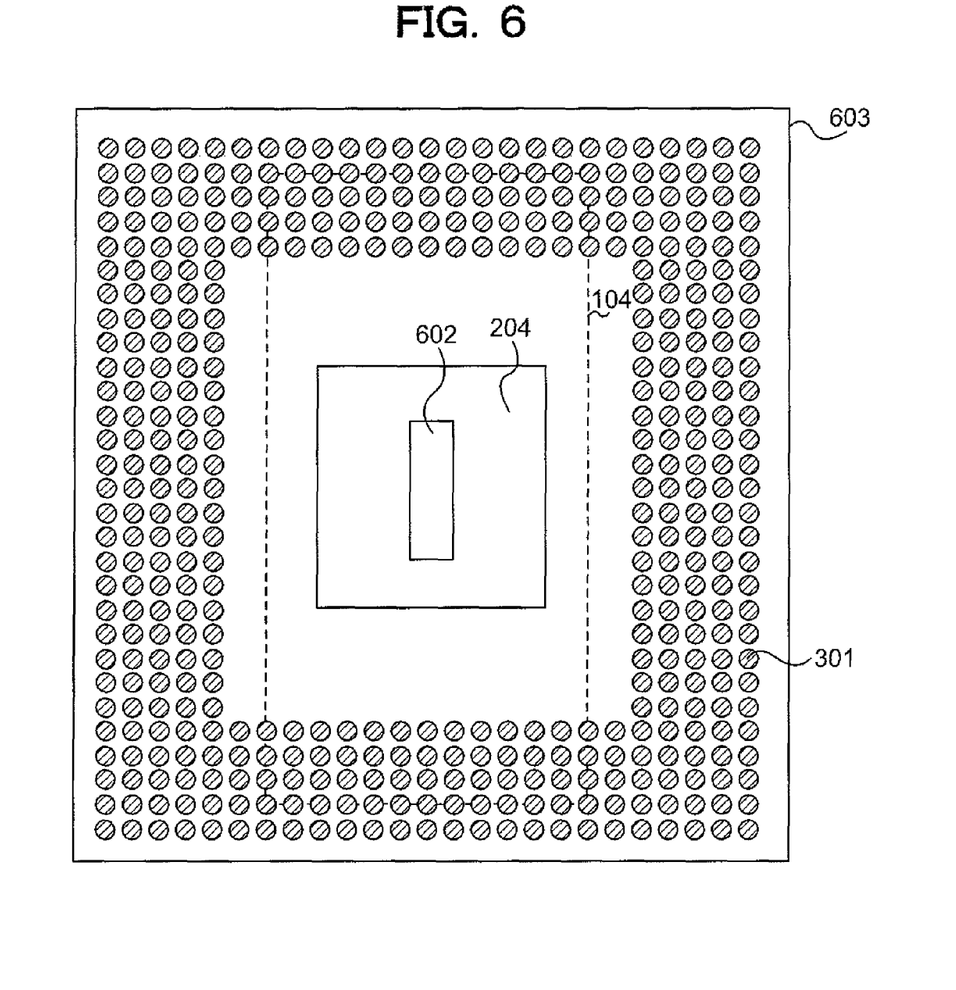
FIG. 6 is a diagram showing the planar structure of the wiring board and semiconductor device of the present embodiment.
Figure 7:
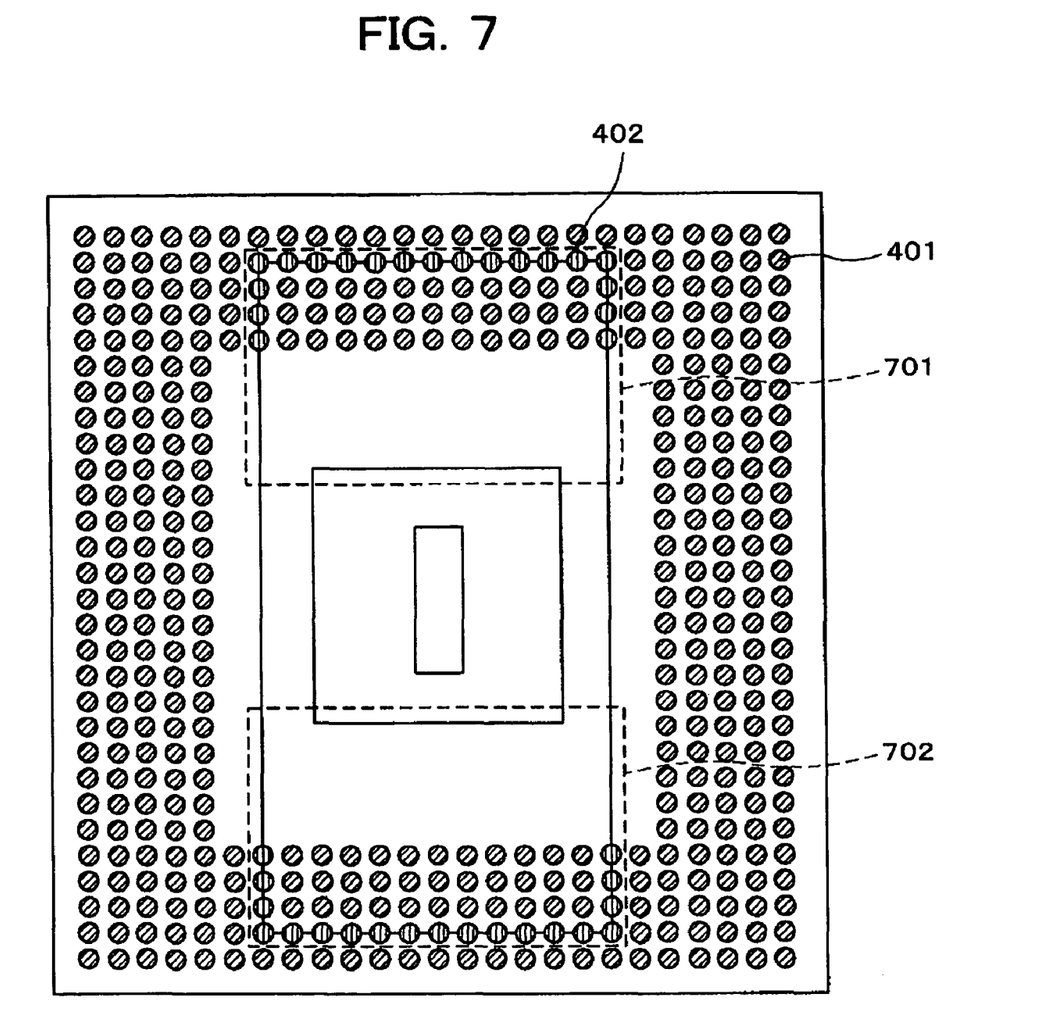
FIG. 7 is a diagram showing the planar structure of the wiring board and semiconductor device of the present embodiment.
Figures 8A, 8B:
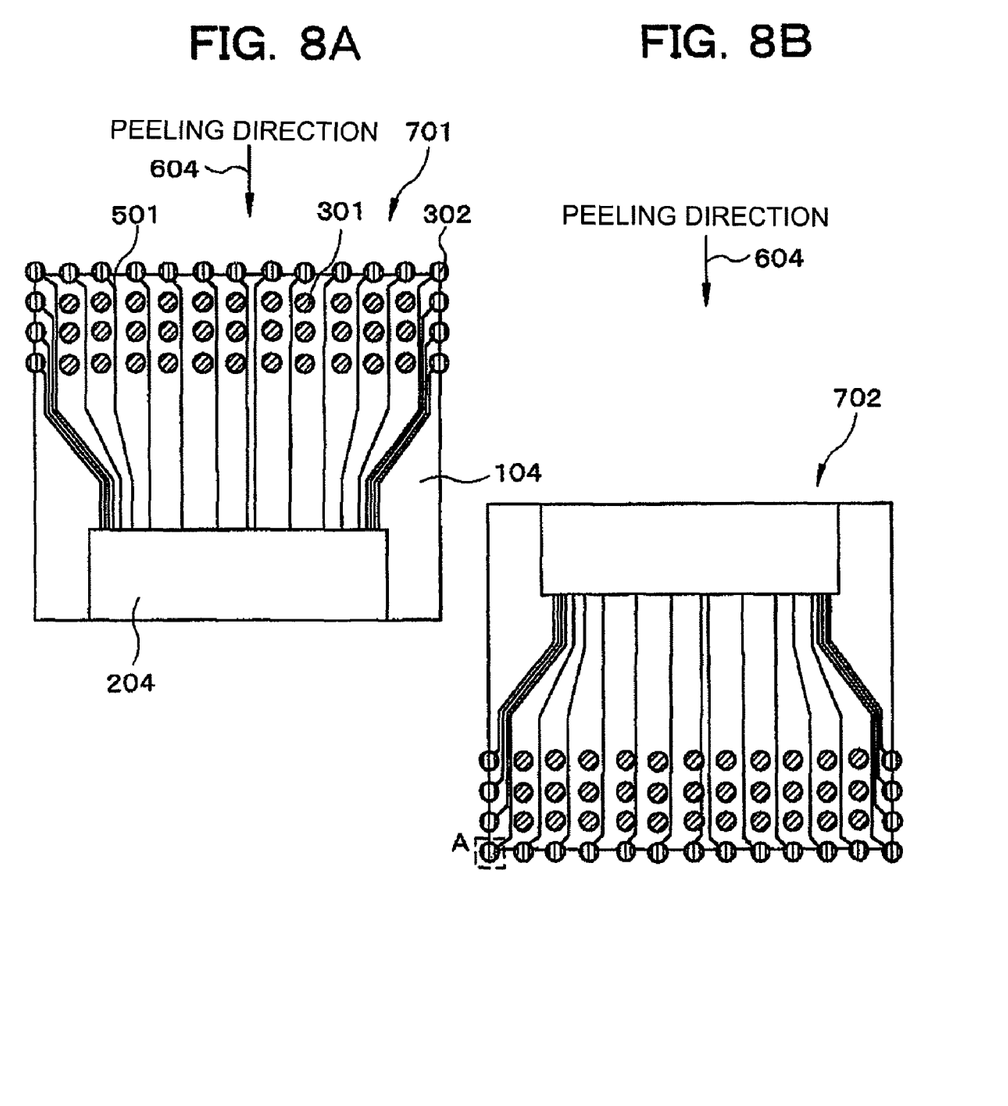
FIG. 8 is an enlarged view of the planar structure of the wiring board and semiconductor device of the prior art.

FIG. 6 is a top view showing the semiconductor device 700 of the embodiments of the present invention. Shown in the diagram are BGA lands 301, as well as two LSIs 104 and 204 mounted on the two sides of a wiring board disposed therebetween. FIG. 7 is a diagram showing the result of distinguishing two types of BGA lands of the semiconductor device shown in FIG. 6, i.e., boundary second BGA lands 402 disposed in positions in which the external peripheral edge of the semiconductor element transverse the interior of the lands, and the other lands 401. FIGS. 8A and 8B are enlarged views of the portions (701 and 702) surrounded by the broken lines in FIG. 7 in the prior art. The peeling direction 604 is also indicated in FIG. 8. In the prior art, the conductive wiring and the BGA lands are radially connected from the center of the semiconductor device toward the external periphery, as shown in portion A of FIG. 8B.

It is apparent from research conducted by the inventors that when the BGA lands and the conductive wiring are radially connected in this manner, defects do not particularly occur when peeling first progresses from the BGA lands side, but when peeling first progresses from the narrow wiring side and the BGA lands are left unpeeled, stress becomes concentrated in the narrow wiring during peeling of the BGA lands portion, resulting in cases in which breaks and cracks are produced in the wiring. In particular, many defects are produced in locations (lands and connections) in which the width rapidly increases from the wiring to the circular lands. It was discovered from a detailed analysis of the results that, in this case, the peeling section is a curved surface having a particular curvature, and that a rapid change in the stress applied to the boundary area produces wiring breakages when peeling progresses to such locations. This change is produced because the deformation of the harder silicon is less than the deformation of the mold resin in the vicinity of the boundary (vicinity of the boundary second BGA lands 402) in which the silicon LSI having a different hardness level is sealed in the mold resin. In areas in which a silicon LSI is not present and in areas other than those in the vicinity of the boundary with the silicon LSI, peeling can be conducted without particularly producing any defects in the wiring area, even if peeling progresses from the wiring side toward the BGA side. As used herein, the term "vicinity" refers to two rows of lands each on the outer and inner sides of the boundary second BGA lands.

Figures 9A, 9B:
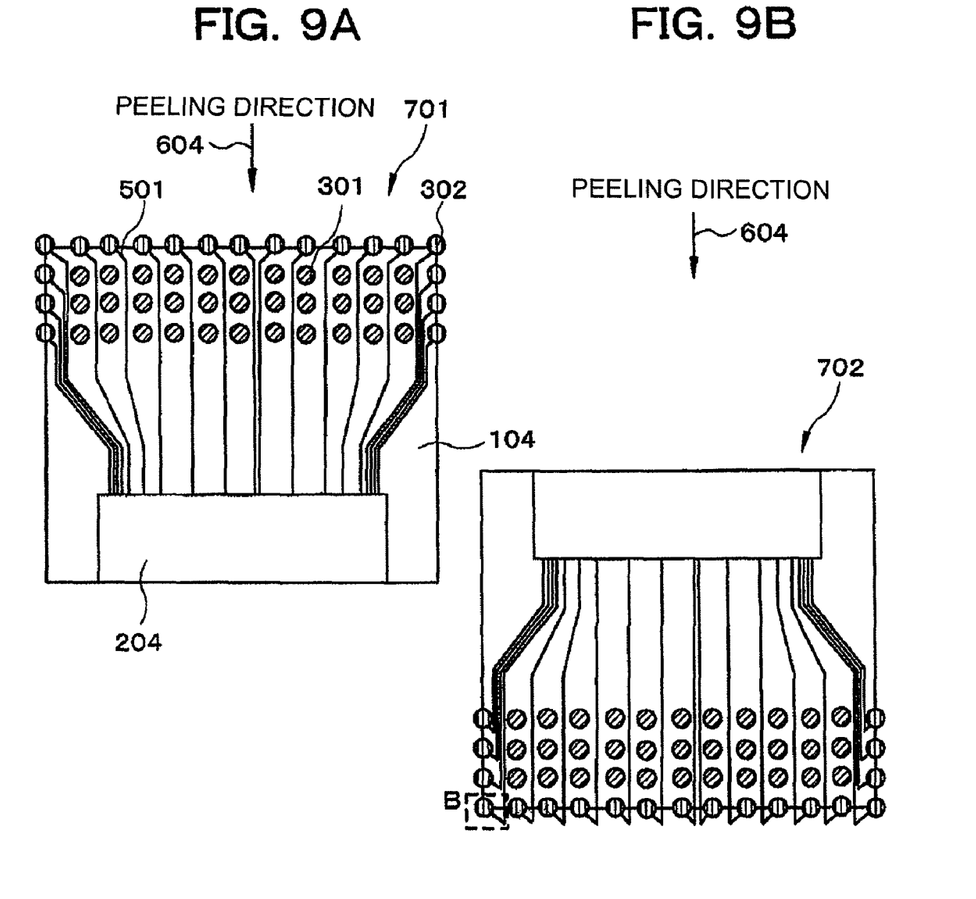
FIG. 9 is an enlarged view of the planar structure of the wiring board and semiconductor device of the present embodiment.

FIGS. 9A and 9B are enlarged views of the portions (702 and 702) surrounded by the broken lines in FIG. 7 in the present embodiment. The present embodiment features wiring and connection portions that are disposed in the opposite direction from the peeling direction for the BGA lands in the vicinity of the boundary with the silicon LSI, where the peeling direction is the direction from the wiring side toward the BGA lands, as shown in portion B of FIG. 9B.

Adopting such a structure allows wiring cracks and breakages caused by locally concentrated stress during peeling to be prevented and high-yield production of semiconductor devices to be achieved. FIG. 9 shows a structure in which the connection direction is opposite from the peeling direction only in the lands on the boundary with the silicon LSI, but the present invention remains substantially effective as long as connection portions in at least a portion of lands selected from the lands in the vicinity of the silicon LSI are varied. It is apparent that good effect can be achieved for all the lands in the vicinity as long as the connection portions are varied, and the connection portions may be varied in relation to all or a portion of the lands on the boundary with the silicon LSI for convenience in wiring and determining the number of pins.

Figures 10A, 10B:
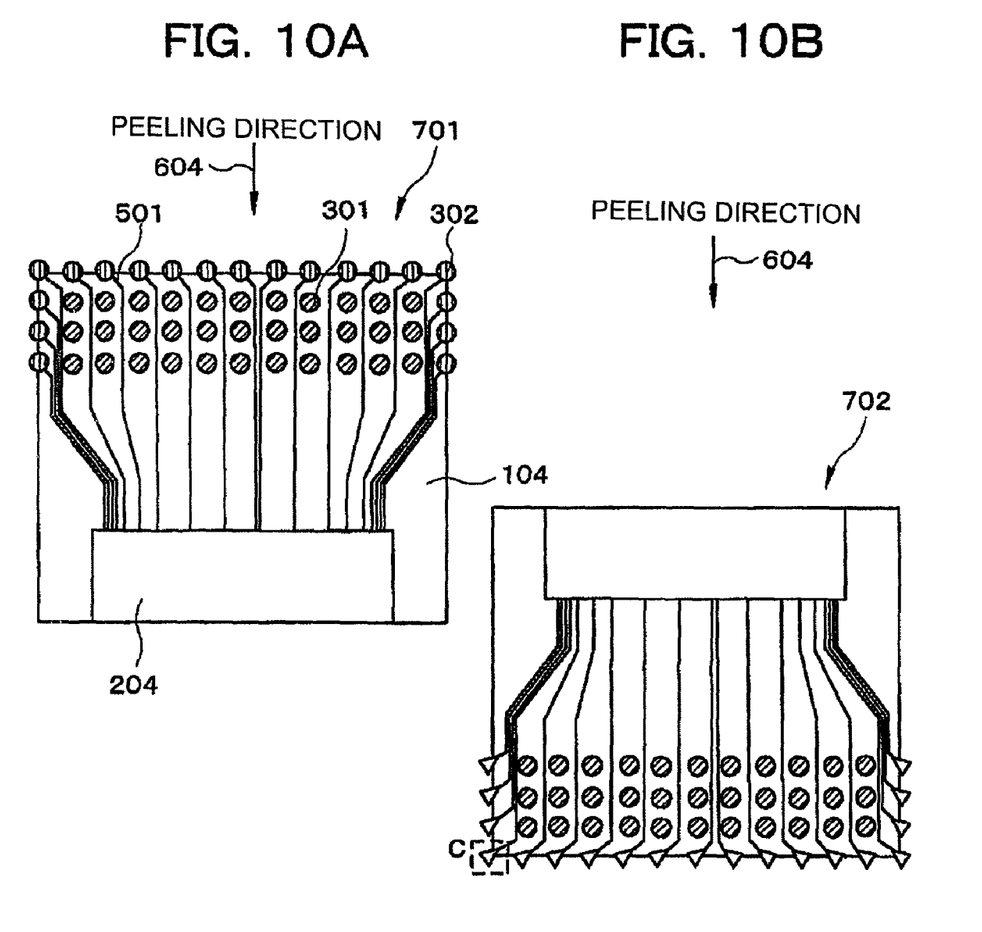
FIG. 10 is an enlarged view showing the planar structure of the wiring board and semiconductor device of the second embodiment of the present invention.

FIGS. 10A and 10B are enlarged views showing the second embodiment of the present invention. The present embodiment features BGA lands in the vicinity of the boundary with the silicon LSI, where peeling is directed from the wiring toward the BGA lands. These lands are shaped so as to gradually increase and then gradually decrease in width in the direction away from the portions connected to the wiring layers formed in the same plane as the lands, and toward one side of the wiring board, as shown in portion C of FIG. 10B.

The BGA lands and the wiring are radially connected from the center of the semiconductor device toward the external periphery in the same manner as in the prior art. In FIG. 10, the lands are triangularly shaped, and adopting such a shape makes it possible to prevent peeling-induced wiring breakages and cracks from occurring. The cracks and breakages can be prevented because the width of the conductor during peeling does not rapidly increase in contrast to a circular land, even if peeling is first started from the wiring portion. The lands are not limited to a triangular shape and can have any shape as long as the width of the lands does not rapidly vary. However, the surface areas are preferably substantially equal to other circular lands in order to align the height of the BGA, which forms the ultimate external terminals. FIG. 10 shows a structure having a different shape only in the lands on the boundary with the silicon LSI, but the present invention remains substantially effective as long as at least a portion of lands selected from lands in the vicinity of the silicon LSI is varied. It is apparent that good effect can be achieved for all the lands in the vicinity as long as the connection portions are varied, and the connection portions may be varied in relation to all or a portion of the lands on the boundary with the silicon LSI. The structure of the present second embodiment has the effect of allowing compatibility with a narrower land pitch than in the first embodiment because the wiring is not required to be drawn to the opposite side of the BGA.

Figures 11A, 11B:
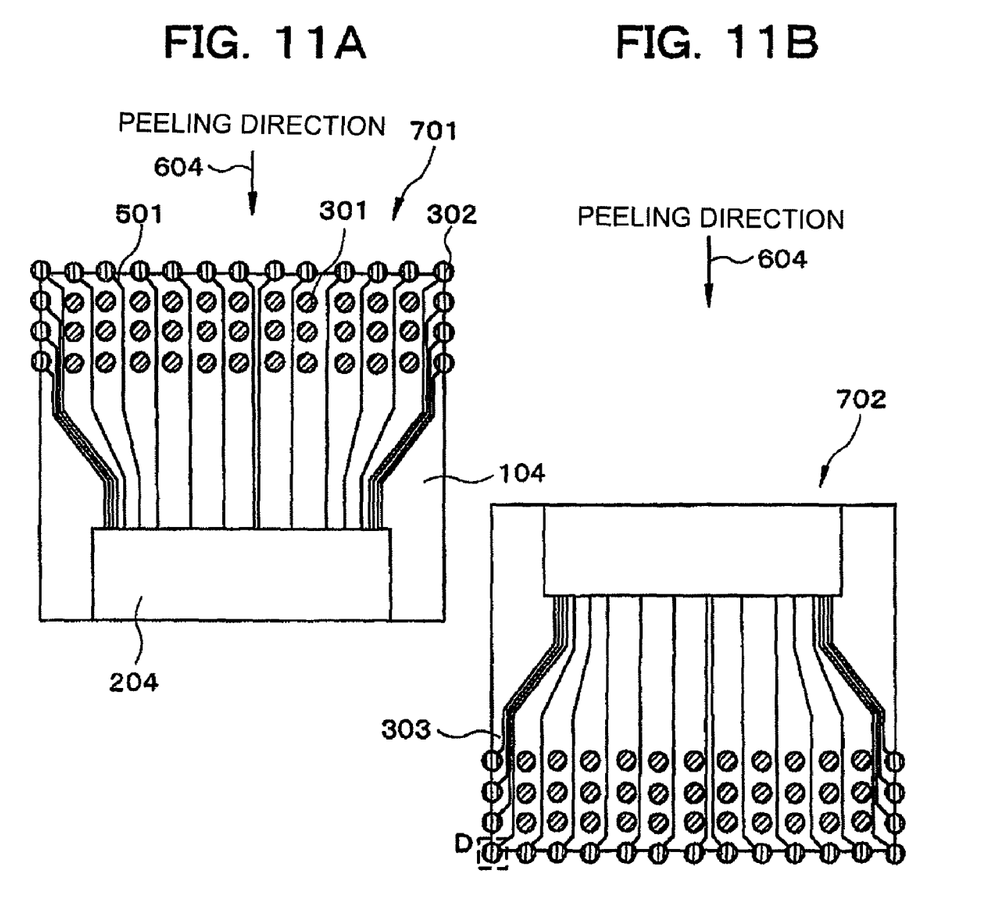
FIG. 11 is an enlarged view showing the planar structure of the wiring board and semiconductor device of the third embodiment of the present invention.
Figure 12:
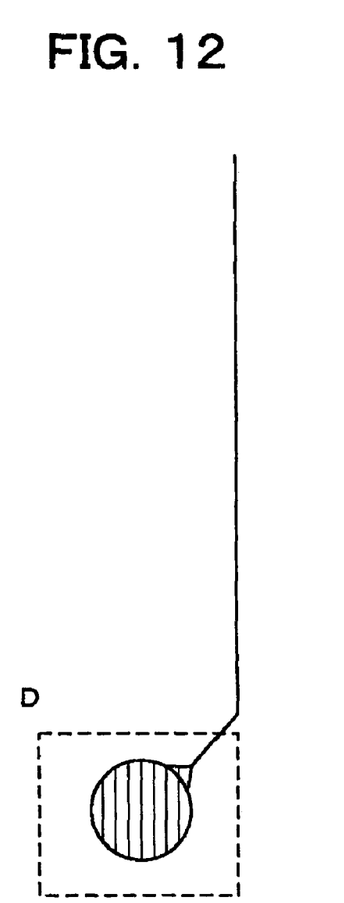
FIG. 12 is a locally enlarged view of the same.

FIGS. 11A and 11B are diagrams showing the third embodiment of the present invention. The present embodiment features tapered shapes in the wiring and connection portions only in the BGA lands in the vicinity of the boundary with the silicon LSI, where peeling is directed from the wiring toward the BGA lands. FIG. 12 is an enlarged view of portion D in FIG. 11B. By adopting such a shape, wiring breakages and cracks do not occur due to peeling because the width of the conductor during peeling does not rapidly increase in contrast to a circular land, even if peeling is first started from the wiring portion. The tapered shape is not limited to the structure shown in FIG. 11, and any structure can be used as long as the width of the wiring does not rapidly vary. FIG. 11 shows a structure having a tapered shape only in the lands on the boundary with the silicon LSI, but the present invention remains substantially effective as long as at least a portion of lands selected from lands in the vicinity of the silicon LSI is tapered. It is apparent that good effect can be achieved as long as all the lands in the vicinity are tapered. It is also possible for all or a portion of the lands solely on the boundary with the silicon LSI to be tapered. The structure of the third embodiment has the effect of allowing compatibility with a very small land pitch and dispensing with the need to draw the wiring to the opposite side of the BGA in contrast to the first and second embodiments. Since the land shapes are circular and merely a tapered shape is imparted, good secondary mounting reliability can also be obtained because the ultimate shapes of the BGA terminals are substantially the same.

The wiring board and semiconductor device of the present invention features land shapes and shapes for connecting the wiring to the lands, and the process for peeling structures from a silicon board, which is the substrate, plays a particularly important role. It is therefore very important that peeling in the present invention be limited to a fixed direction, and the characteristic structure of the present invention described in the first to third embodiments requires that a manufacturing method be adopted in which the peeling direction is always to the downstream side.

An example of a silicon board as the substrate was described in the above embodiments, but the present invention is not limited to a silicon board, and any substrate can be used as long as the board has suitable rigidity in the steps in which wiring and insulation layers are formed. Examples of materials that can be used include GaAs and other semiconductor wafer materials; sapphire; copper and other metal plates; and quartz, glass, ceramic, and printed boards. In the particular case that a silicon board is used, an effect is obtained in which the mounting precision is further increased because the coefficients of thermal expansion of the board and LSI are kept equal to each other when the LSI is mounted.

In the embodiments described above, an example of two LSIs constituting a semiconductor device was described, but the present invention is not limited to two LSIs, and two or more LSIs may be mounted on one or both sides of the wiring board. In such a case, two or more LSIs may be stacked in the vertical direction, or may be laterally mounted in the horizontal direction. In either case, the same effects can be obtained as long as the features in the embodiments described above are imparted to lands in the vicinity of the mounted positions of the LSI, which lands have external connection terminals disposed therein. In particular, when multiple layers of memory chips having a large chip size are stacked, semiconductor device performance can be considerably improved because logic chips that perform signal processing can access large-capacity memory at high speed.

In the embodiments described above, an example of a wiring board having two wiring layers was described, but it is apparent that the effects of the present invention are not limited to bilayer wiring.

In the embodiments described above, thin-film capacitors may also be disposed in desired positions on the wiring board. The dielectric material constituting the thin film capacitors is preferably titanium oxide, tantalum oxide, aluminum oxide, zirconium oxide, hafnium oxide, silicon oxide, silicon nitride, or a compound composed of these; BST ($Ba_xSr_{1-x}TiO_3$), PZT ($PbZr_xTi_{1-x}O_3$), PLZT ($Pb_{1-y}La_yZr_xTi_{1-x}O_3$), or another perovskite material ($0 \leq x \leq 1$ and $0 < y < 1$); or $SrBi_2Ta_2O_9$ or another Bi-based layered compound. Also, an organic material or the like in which an inorganic material or a magnetic material is added may be used as the dielectric material constituting the thin-film capacitors. Chip capacitors, chip resistors, chip inductors, and other separate chip components may furthermore be housed in place of the thin-film capacitors.

What is claimed is:

1. A semiconductor device comprising;
a flat wiring board;
a first semiconductor element disposed on one surface of said wiring board; and
a second semiconductor element disposed on another surface of said wiring board, said wiring board comprising:
a wiring layer including conductor wiring; and
a sealing resin for covering said one surface and a side face of said first semiconductor element;
a support layer for supporting said wiring layer, and a through-electrode that passes through said wiring layer and said support layer; and
a plurality of lands on which external connection terminals are provided, wherein
said first semiconductor element and said second semiconductor element are electrically connected;
a connection point is formed between a first land from among said plurality of lands and said wiring layer through said conductor wiring, the first land provided in the vicinity of an outer peripheral edge of the first semiconductor element, and the conductor wiring formed in the same plane as the first land,
said conductor wiring, which forms said connection point, extends beyond a center line of the first land, the center line being parallel to outer peripheral edge-edges of the first semiconductor element, when viewed from vertically above.

2. The semiconductor device according to claim 1, wherein said support layer is an insulation layer composed of an organic resin.

3. A semiconductor device comprising;
a flat wiring board;
a first semiconductor element disposed on one surface of said wiring board; and
a second semiconductor element disposed on another surface of said wiring board, said wiring board comprising:
  a wiring layer;
  a sealing resin for covering said one surface and a side face of said first semiconductor element;
  a support layer for supporting said wiring layer, and a through-electrode that passes through said wiring layer and said support layer; and
  a plurality of lands on which external connection terminals are provided, wherein said first semiconductor element and said second semiconductor element are electrically connected,
  the plurality of lands include a first land, which is partially covered by the first semiconductor element when viewed from vertically above, and
  connection point between plurality of lands the first land and the wiring layer in the same plane as said first land, is formed outside fan outer periphery of an of the first semiconductor element, when viewed vertically from above.

4. The semiconductor device according to claim 3, wherein said support layer is an insulation layer composed of an organic resin.

5. A semiconductor device comprising:
a flat wiring board;
a first semiconductor element disposed on one surface of said wiring board; and
a second semiconductor element disposed on another surface of said wiring board, said wiring board comprising:
  a wiring layer;
  a sealing resin for covering said one surface and a side face of said first semiconductor element;
  a support layer for supporting said wiring layer, and a through-electrode that passes through said wiring layer and said support layer; and
  a plurality of lands on which external connection terminals are provided, wherein said first semiconductor element and said second semiconductor element are electrically connected,
  at least one of said plurality of lands includes a projection, which is connected to the wiring layer formed in the same plane as said at least one land, when viewed vertically from above.

6. The semiconductor device according to claim 5, wherein said support layer is an insulation layer composed of an organic resin.

7. A semiconductor device comprising:
a flat wiring board;
a first semiconductor element disposed on one surface of said wiring board; and
a second semiconductor element disposed on another surface of said wiring board, said wiring board comprising:
  a wiring layer;
  a sealing resin for covering said one surface and a side face of said first semiconductor element;
  a support layer for supporting said wiring layer, and a through-electrode that passes through said wiring layer and said support layer; and
  a plurality of lands on which external connection terminals are provided, wherein
  said first semiconductor element and said second semiconductor element are electrically connected,
  the plurality of lands include a first land, which is partially covered by the first semiconductor element when viewed from vertically above, and
  said first land includes a projection, which is connected to the wiring layer formed in the same plane as said first land, when viewed vertically from above.

8. The semiconductor device according to claim 7, wherein said support layer is an insulation layer composed of an organic resin.

9. A semiconductor device comprising:
a flat wiring board;
a first semiconductor element disposed on one surface of said wiring board; and
a second semiconductor element disposed on another surface of said wiring board, said wiring board comprising:
  a wiring layer;
  a sealing resin for covering said one surface and a side face of said first semiconductor element;
  a support layer for supporting said wiring layer, and a through-electrode that passes through said wiring layer and said support layer; and
  a plurality of lands on which external connection terminals are provided, wherein said first semiconductor element and said second semiconductor element are electrically connected,
  connection portion between at least one of said plurality of lands, which is provided in the vicinity of an outer peripheral edge of the first semiconductor element, and the wiring layer formed in the same plane as said at least one land, is tapered only toward a predetermined side of the wiring board, when viewed from vertically above.

10. The semiconductor device according to claim 9, wherein said support layer is an insulation layer composed of an organic resin.

11. A semiconductor device comprising:
a flat wiring board;
a first semiconductor element disposed on one surface of said wiring board; and
a second semiconductor element disposed on another surface of said wiring board, said wiring board comprising:
  a wiring layer;
  a sealing resin for covering said one surface and a side face of said first semiconductor element;
  a support layer for supporting said wiring layer, and a through-electrode that passes through said wiring layer and said support layer; and
a plurality of lands on which external connection terminals are provided, wherein
said first semiconductor element and said second semiconductor element are electrically connected,
  the plurality of lands include a first land, which is partially covered by the first semiconductor element, when viewed from vertically above,
  connection portion between the first land and the wiring layer formed in the same plane as said at least one land, is tapered only toward a predetermined side of the wiring board, when viewed from vertically above.

12. The semiconductor device according to claim 11, wherein said support layer is an insulation layer composed of an organic resin.

* * * * *